(12) United States Patent
Gao et al.

(10) Patent No.: US 12,514,074 B2
(45) Date of Patent: Dec. 30, 2025

(54) ARRAY SUBSTRATE AND DISPLAY PANEL

(71) Applicant: KunShan Go-Visionox Opto-Electronics Co., Ltd, Jiangsu (CN)

(72) Inventors: Linhua Gao, Kunshan (CN); Zhili Ma, Kunshan (CN); Zhengyong Zhu, Kunshan (CN); Pei Duan, Kunshan (CN)

(73) Assignee: KunShan Go-Visionox Opto-Electronics Co., Ltd, Kunshan (CN)

( * ) Notice: Subject to any disclaimer, the term of this patent is extended or adjusted under 35 U.S.C. 154(b) by 438 days.

(21) Appl. No.: 18/340,300

(22) Filed: Jun. 23, 2023

(65) Prior Publication Data

US 2023/0337483 A1 Oct. 19, 2023

Related U.S. Application Data

(63) Continuation of application No. PCT/CN2022/074265, filed on Jan. 27, 2022.

(30) Foreign Application Priority Data

Feb. 8, 2021 (CN) .......................... 202110183509.4

(51) Int. Cl.
*H10K 59/126* (2023.01)
*H10D 86/40* (2025.01)
(Continued)

(52) U.S. Cl.
CPC ................................. *H10K 59/126* (2023.02)

(58) Field of Classification Search
CPC ..... H10K 59/126; H10K 59/131; H10D 86/40
See application file for complete search history.

(56) References Cited

U.S. PATENT DOCUMENTS

| | | |
|---|---|---|
| 2011/0241005 A1 | 10/2011 | Ro et al. |
| 2014/0084286 A1 | 3/2014 | Jeon et al. |

(Continued)

FOREIGN PATENT DOCUMENTS

| | | |
|---|---|---|
| CN | 1874001 B | 7/2010 |
| CN | 206618932 U | 11/2017 |

(Continued)

OTHER PUBLICATIONS

International Search Report issued on Mar. 8, 2022, in corresponding International Patent Application No. PCT/CN2022/074265, 5 pages.

(Continued)

*Primary Examiner* — Mohsen Ahmadi
(74) *Attorney, Agent, or Firm* — Maier & Maier, PLLC

(57) ABSTRACT

An array substrate and a display panel. The array substrate includes: a substrate; a patterned shielding layer, having a fixed potential, arranged on one side of the substrate, and includes multiple shielding units connected to each other; and a driving circuit layer, arranged on one side of the shielding layer away from the substrate and comprising multiple driving transistors. An orthographic projection of each of the plurality of driving transistors projected on the shielding layer at least partially covers a corresponding one of the shielding units.

19 Claims, 3 Drawing Sheets

(51) Int. Cl.
*H10D 86/60* (2025.01)
*H10K 59/12* (2023.01)
*H10K 59/121* (2023.01)
*H10K 59/131* (2023.01)

(56) References Cited

U.S. PATENT DOCUMENTS

| | | | |
|---|---|---|---|
| 2015/0123081 A1* | 5/2015 | Huang | H10K 59/1315 |
| | | | 257/40 |
| 2019/0005885 A1 | 1/2019 | Kim et al. | |
| 2019/0198594 A1* | 6/2019 | Lee | H10D 30/6746 |
| 2019/0252413 A1* | 8/2019 | Xu | H10D 86/0221 |
| 2020/0175243 A1* | 6/2020 | Liu | G06V 40/1318 |
| 2020/0381524 A1* | 12/2020 | Xu | H10D 30/6723 |
| 2021/0367017 A1* | 11/2021 | Liu | H10D 86/60 |
| 2022/0181454 A1* | 6/2022 | Xu | H10D 86/0221 |

FOREIGN PATENT DOCUMENTS

| | | |
|---|---|---|
| CN | 107452809 A | 12/2017 |
| CN | 107623042 A | 1/2018 |
| CN | 108269826 A | 7/2018 |
| CN | 111584587 A | 8/2020 |
| CN | 111863837 A | 10/2020 |
| CN | 113053912 A | 6/2021 |
| KR | 1020190135585 A | 12/2019 |
| KR | 1020200089743 A | 7/2020 |

OTHER PUBLICATIONS

Notification to Grant Patent issued on Aug. 1, 2022, in corresponding Chinese Application No. 202110183509.4, 6 pages.
Office Action issued on Dec. 16, 2024, in corresponding Korean Application No. 10-2023-7022262, 11 pages.

* cited by examiner

ARRAY SUBSTRATE AND DISPLAY PANEL

CROSS REFERENCE TO RELATED APPLICATIONS

The present disclosure is a continuation of International Patent Application No. PCT/CN2022/074265, filed on Jan. 27, 2022, which claims priority to Chinese Patent Application No. 202110183509.4 filed on Feb. 8, 2021 in the National Intellectual Property Administration of China, the content of which is herein incorporated by reference in their entireties.

TECHNICAL FIELD

Embodiments of the present disclosure relate to the field of display technology, and in particular to an array substrate and a display panel.

BACKGROUND

In recent years, AMOLED display technology has become increasingly mature. Since the AMOLED display technology has excellent characteristics such as having a good flexibility, a high contrast, a thin thickness, a low power consumption, a low latency, a low temperature resistance, or the like, the AMOLED display technology has become the mainstream technology in the field of mobile phone displays. Currently, users have put forward requirements for AMOLED phones such as high refresh rates. AMOLED display panels with high refresh rates may eliminate image flicker and jitter, and bring the users smoother user experiences; at the same time, higher requirements are put forward for the stability of transistors of the AMOLED display panels.

Under high refresh rates, some display mura or defects in the AMOLED display panels will be amplified, especially in environments such as illuminated by high-brightness light and subjected to friction static electricity, the display panels are prone to having problems such as display anomalies or flashing.

SUMMARY

Some embodiments of the present disclosure provide an array substrate and a display panel, in order to reduce the impact of high-brightness light and frictional static electricity on the stability of a driving transistor.

In order to sole the above technical problem, one technical solution adopted by some embodiments of the present disclosure is to provide an array substrate, and the array substrate includes: a substrate; a patterned shielding layer, having a fixed potential, arranged on one side of the substrate, and comprising a plurality of shielding units connected to each other; and a driving circuit layer, arranged on one side of the shielding layer away from the substrate and comprising a plurality of driving transistors. An orthographic projection of each of the plurality of driving transistors projected on the shielding layer at least partially covers a corresponding one of the shielding units.

In order to sole the above technical problem, another technical solution adopted by some embodiments of the present disclosure is to provide a display panel, and the display panel includes any of the array substrates described in the above embodiments.

Distinguished from the related art, the technical effect of the present disclosure is as follows: the array substrate provided in some embodiments of the present disclosure includes a shielding layer located between the driving circuit layer and the substrate, the shielding layer has a fixed potential. The shielding layer includes a plurality of shielding units connected to each other, an orthographic projection of each of the plurality of driving transistors projected on the shielding layer at least partially covers a corresponding one of the shielding units. On one hand, the shielding units may block external ambient light coming from one side where the substrate is located, thereby enhancing the illumination stability of the driving transistors. On the other hand, each of the shielding units has a fixed potential and a function of electrostatic shielding, such that an anti-static ability of each driving transistor at the corresponding position is improved, and the illumination stability of each driving transistor is improved, and the probability of having display anomalies or flickering issues in the display panel may be reduced.

BRIEF DESCRIPTION OF THE DRAWINGS

In order to illustrate the technical solutions in some embodiments of the present disclosure clearer, the drawings used for the description of the embodiments will be briefly described. Apparently, the drawings described below only shows some embodiments of the present disclosure. One skilled in the art may acquire other drawings based on these drawings without making any inventive work.

DETAILED DESCRIPTION

Technical solutions of some embodiments of the present disclosure will be clearly and completed described with reference to the drawings of some embodiments. Apparently, the embodiments described herein are only some the embodiments of the present disclosure, but not all embodiments of the present disclosure. Any other embodiments that may be obtained by one skilled in the art based on the embodiments of the present disclosure without creative effort are within the scope of the present disclosure.

Figure 1:
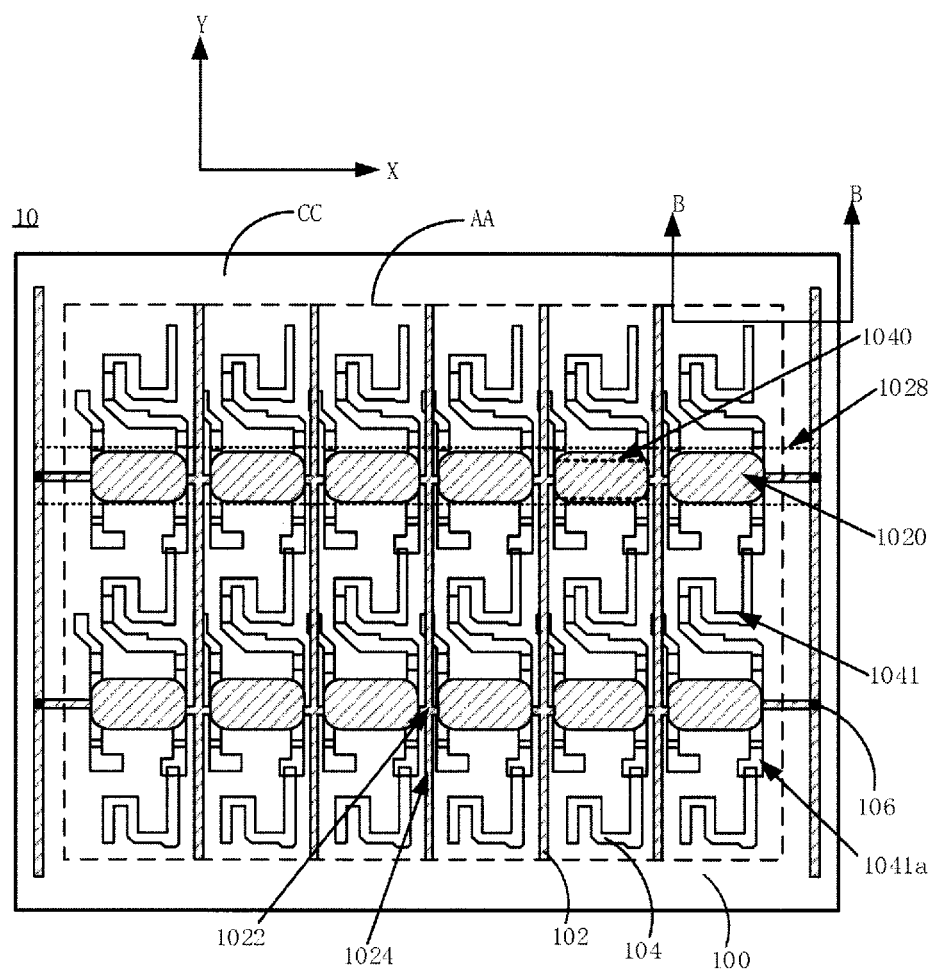
FIG. 1 is a schematic structural view of an array substrate according to some embodiments of the present disclosure.
Figure 2:
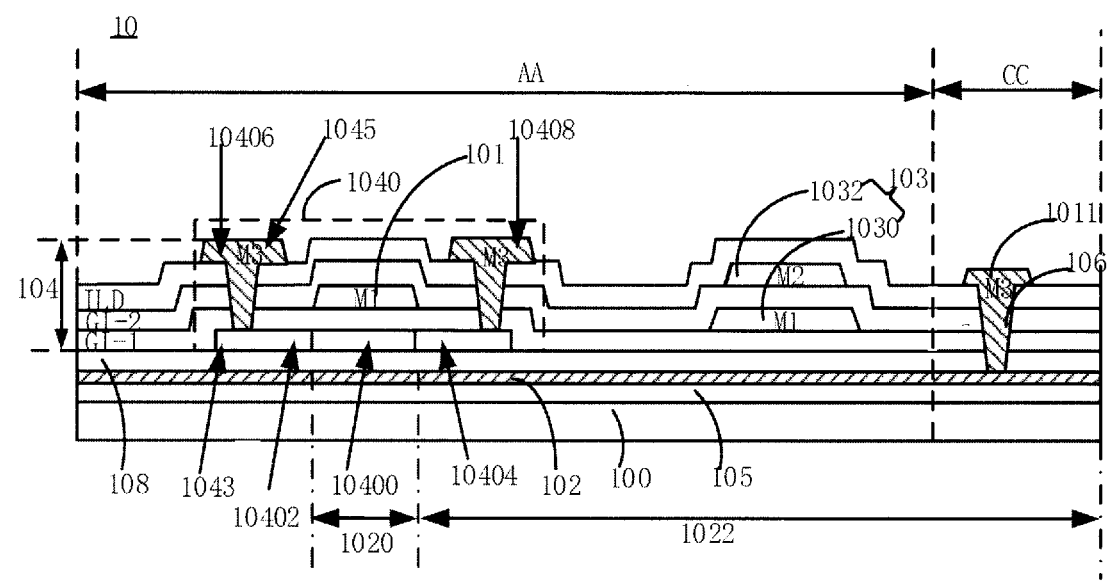
FIG. 2 is a schematic sectional view of the array substrate along the section line B-B in FIG. 1 according to some embodiments of the present disclosure.

As shown in FIGS. 1 and 2, FIG. 1 is a schematic structural view of an array substrate according to some embodiments of the present disclosure, and FIG. 2 is a schematic sectional view of the array substrate along the section line B-B in FIG. 1 according to some embodiments of the present disclosure. The array substrate 10 includes a substrate 100, a patterned shielding layer 102, and a driving circuit layer 104.

The substrate 100 may include a rigid material (such as glass or the like), or a flexible material (such as polyimide or the like). The shielding layer 102 is located on one side of the substrate 100 and has a fixed potential. The shielding layer 102 includes a plurality of shielding units 1020 connected to each other. The fixed potential of the shielding layer 102 may be provided by signal lines inherent or already existed in the array substrate 10 that have fixed potentials, such as an ELVDD power supply line, an ELVSS power supply line, a VREF (Voltage reference) signal line, etc. Specific selection scenarios are detailed in the following detailed description. In other embodiments, an additional signal line with a fixed potential may be added to the array substrate 10. The driving circuit layer 104 is located on one side of the shielding layer 102 opposite to or away from the substrate 100, and may include a plurality of driving circuit units (not labeled). Each driving circuit unit may include one driving transistor 1040 and at least one switch transistor 1041. An orthogonal projection of each driving transistor 1040 projected on the shielding layer 102 at least partially covers a corresponding one of the shielding units 1020, i.e., each driving transistor 1040 has a corresponding one shielding unit 1020 disposed directly or right below a side of the each driving transistor 1040 facing or close to the substrate 100. The shielding units 1020 may be able to block external ambient light transmitted from the side where the substrate 100 is located, thereby enhancing an illumination stability of the driving transistors 1040. Moreover, each of the shielding units 1020 have a fixed potential and may provide electrostatic shielding, thereby improving an antistatic ability of the driving transistor 1040 at the position corresponding to the each of the shielding units 1020.

In some embodiments, the material of the shielding layer 102 may include a non-transparent metal (such as molybdenum or the like) or a semiconductor material (such as a-Si or the like). In case that the material of the shielding layer 102 is a non-transparent metal, when external ambient light transmitted from the side of the substrate 100 away from the driving circuit layer 104 is transmitted to the shielding layer 102, the external ambient light transmitted to the shielding layer 102 may be reflected by the shielding layer 102, so that the external ambient light will not be transmitted to the driving transistors 1040 at the corresponding positions, and the illumination stability of the driving transistors 1040 may be enhanced. In case that the material of the shielding layer 102 is a semiconductor material, when the external ambient light transmitted from the side of the driving circuit layer 104 away from the substrate 100 is transmitted to the shielding layer 102, the external ambient light transmitted to the shielding layer 102 may be absorbed by the shielding layer 102, so that the external ambient light will not be transmitted to the driving transistors 1040 at the corresponding positions, and the illumination stability of the driving transistors 1040 may be enhanced.

As further shown in FIG. 1, the plurality of driving transistors 1040 in the driving circuit layer 104 are arranged along a first direction X and a second direction Y intersected with each other. In some embodiments, the first direction X and the second direction Y may be substantially perpendicular to each other. The shielding layer 102 also includes a plurality of first connecting members 1022. Two adjacent shielding units 1020 are connected to each other through a corresponding one of the first connecting members 1022 in the first direction X. That is, the first connecting members 1022 extend in the first direction X. This design allow the potentials of the plurality of shielding units 1020 connected to each other in the first direction X as similar to each other as possible, so that the performances of the plurality of driving transistors 1040 in the first direction X are uniform.

Furthermore, as shown in FIG. 1, the shielding layer 102 also includes a plurality of second connecting members 1024. Two adjacent first connecting members 1022 of the plurality of first connecting members 1022 are connected to each other through a corresponding one of the plurality of second connecting members 1024 in the second direction Y. That is, the second connecting members 1024 extend in the second direction Y. This design allow the shielding layer 102 to have a mesh structure, and the potentials of all the shielding units 1020 are made as similar to each other as possible, so that the performances of all the driving transistors 1040 are relatively uniform.

In addition, in some embodiments, each of the plurality of above-mentioned second connecting members 1024 may extend in a straight line; or each of the plurality of second connecting members 1024 may also extend in an irregular curve line or zigzag line. An orthographic projection of each second connecting member 1024 projected onto the substrate 100 does not overlap with or is non-overlapping with an orthographic projection of a channel 1041a of the corresponding one of the at least one switch transistor 1041 around or surrounding the each second connecting member 1024 or an orthographic projection of any other metal wirings projected on the substrate 100. This design allows the second connecting members 1024 to avoid or keep clear of the channel of the at least one switch transistor around or surrounding the each second connecting member 1024 and keep clear of several upper metal wirings by winding, thereby reducing the impact of the second connecting members 1024 on the surrounding switch transistor and avoiding an increase in parasitic capacitance.

In some embodiments, the shielding layer 102 including the plurality of shielding units 1020, the plurality of first connecting members 1022, and the plurality of second connecting members 1024 is an integral structure. In some embodiments, the shielding layer 102 may be composed of the shielding units 1020, the first connecting members 1022, and the second connecting members 1024. The shielding layer 102 may be patterned by etching or other methods.

As shown in FIG. 1 and FIG. 2, the array substrate 10 includes a display region AA and a non-display region CC surrounding the display region AA. In the first direction X, a part of the shielding layer 102 located in the non-display region CC is electrically connected to a wiring 1011, which has a fixed potential, of the driving circuit layer 104 located in the non-display region CC through at least one conductive via 106. By connecting the shielding layer 102 to the wiring having the fixed potential through the at least one conductive via 106 at the periphery of the array substrate 10, it is possible to reduce the layout difficulty, and has outstanding advantages for the case with high resolution PPI (Pixels Per Inch).

In some embodiments, as shown in FIG. 1, in the first direction X, the wiring 1011 having a fixed potential is arranged in the non-display region CC of the array substrate 10. The part of the shielding layer 102 located in the non-display region CC has at least two of the plurality of first connecting members 1022 extending into the non-display region CC. Each of the at least two of first connecting members 1022 extending into the non-display region CC is electrically connected to the wiring having a fixed potential through a corresponding one of the at least one conductive via 106.

Of course, in other embodiments, as shown in FIG. 1, at least one of the plurality of second connecting members 1024 may be arranged between two adjacent first connecting members 1022 of the plurality of first connecting members 1022 extending into the non-display region CC. A junction between each of at least two of the plurality of the first connecting members 1022 located in the non-display region CC and a corresponding one of the at least one of the plurality of second connecting members 1024 is connected to the wiring having a fixed potential through the at least one conductive via 106.

Figure 3:
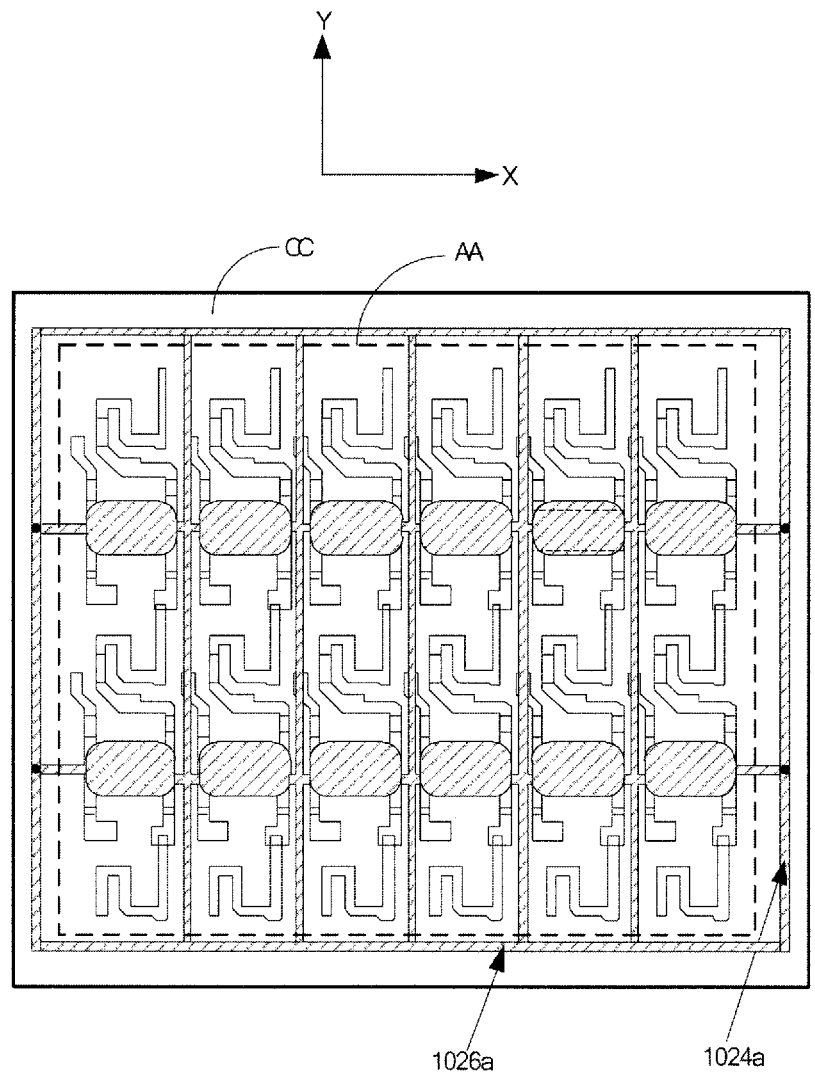
FIG. 3 is a schematic structural view of an array substrate according to some embodiments of the present disclosure.

FIG. 3 is a schematic structural view of an array substrate according to some embodiments of the present disclosure.

As shown in FIG. 3, the shielding layer 102 may further include a plurality of third connecting members 1026a. The plurality of third connecting members are arranged in the non-display region CC. In the first direction X, one of the plurality of third connecting members 1026a is arranged or disposed between two adjacent second connecting members 1024a of plurality of second connecting members 1024a. The at least one of the plurality of second connecting members 1024a located in the non-display region CC and the third connecting members 1026a are connected to each other to form a closed-rectangle structure, such as a square—shape structure.

In some embodiments, as shown in FIG. 1, the shielding units 1020 and the first connecting members 1022 in the first direction X cooperatively form one repeating unit 1028. Two opposite ends of each repeating unit 1028 are located in the non-display region CC and connected to the wiring 1011 having the fixed potential through the at least one conductive via 106. This design may reduce the via resistance, so that the potentials of all the shielding units 1020 in the same repeating unit 1028 in the first direction X are as similar to each other as possible.

As shown in FIG. 2, a first buffer layer 108 is arranged between the driving circuit layer 104 and the shielding layer 102. The material of the first buffer layer 108 may include silicon nitride or the like. The driving transistor 1040 includes a channel region 10400 arranged above the first buffer layer 108. The channel region 10400 has a corresponding one of the plurality of shielding units 1020 arranged below. An orthographic projection of the channel region 10400 projected on the shielding layer 102 is located in the corresponding one of the plurality of shielding units 1020. Since the switching characteristics of the driving transistor 1040 are related to the stability of the channel region 10400, covering the channel region 10400 by a corresponding one of the shielding units 1020 at a position corresponding to the channel region 10400 may make the driving transistor 1040 more resistant to illumination and static electricity, and the switching characteristics of the driving transistor 1040 are more stable.

As shown in FIG. 2, the driving circuit layer 104 further includes a storage capacitor 103. The driving circuit layer 104 includes a patterned polycrystalline silicon active layer 1043, a first gate insulating layer GI-1, a first patterned metal layer M1, a second gate insulating layer GI-2, a second patterned metal layer M2, a first interlayer dielectric layer IDL, and a patterned source-drain layer 1045, which are stacked on one another sequentially in a direction away from the substrate 100. The patterned polycrystalline silicon active layer 1043 includes the aforementioned channel region 10400, a first conductive region (e.g., source region) 10402, and a second conductive region (e.g., drain region) 10404. The first conductive region 10402 and the second conductive region 10404 are located on two opposite sides of the channel region 10400. The first patterned metal layer M1 forms a gate 101 of each driving transistor 1040 and a first electrode plate 1030 of the storage capacitor 103. The second patterned metal layer M2 forms a second electrode plate 1032 of the storage capacitor 103. In some embodiments, the second patterned metal layer M2 may also form a VREF signal line in the driving circuit layer 104. The patterned source-drain layer 1045 is formed by a third metal layer M3. The patterned source-drain layer 1045 forms a source 10406 and a drain 10408 of each driving transistor 1040. The source 10406 of the driving transistor 1040 passes through a portion of the insulating layer at the positions corresponding to or facing the source 10406 and is connected to the first conductive region 10402. The drain 10408 of the driving transistor 1040 passes through a portion of the insulating layer at the positions corresponding to or facing the drain 10408 and is connected to the second conductive region 10404.

In some embodiments, the third patterned metal layer M3 forms a power line ELVDD and a power line ELVSS in the non-display region CC. The power line ELVDD or the power line ELVSS is a wiring that is electrically connected to the shielding layer 102.

In order to reduce the impact of the introduced shielding layer 102 on the light-transmitting region of the array substrate 10, that is, in order to ensure that the introduced shielding layer 102 does not affect the implementation of a fingerprint-recognition function on the screen, orthographic projections of the gate 101 of each driving transistor 1040 and the second electrode plate 1032 projected onto the shielding layer 102 cooperatively cover the corresponding one of the plurality of shielding units 1020 at the corresponding positions; or the orthographic projection of the gate 101 of each driving transistor 1040 projected onto the shielding layer 102 covers the corresponding one of the plurality of shielding units 1020 at the position corresponding to or facing the gate 101. In some embodiments, the gate 101 may form at least parts of the first electrode plate 1030, and the second electrode plate 1032 of the storage capacitor 103 of each driving circuit unit covers the gate 101 of the driving transistor 1040 of the same driving circuit unit. Of course, in other embodiments, the second electrode plate 1032 of the storage capacitor 103 may only cover a part of the gate 101 of the driving transistor 1040 of the same driving circuit unit, and in this case, the corresponding shielding unit 1020 may be arranged below a shading region cooperatively formed by the second electrode plate 1032 of the storage capacitor 103 and the gate 101.

It should be noted that the aforementioned driving transistor 1040 is described by taking a top gate structure as an example. However, the description is also applicable to a bottom gate structure, which is not elaborated on here.

In case that the material of the channel region 10400 of the driving transistor 1040 is a P-type semiconductor, that is, the driving transistor 1040 is a PMOS transistor, the shielding layer 102 has a fixed high-level potential, for example, the shielding layer 102 has the same potential as the power line ELVDD. This design may ensure that the introduced shielding layer 102 will not affect the normal turning on of the driving transistor 1040 at the corresponding position. In some embodiments, as shown in FIG. 2, the shielding layer 102 located in the non-display region CC is electrically connected to the power line ELVDD in the third metal layer M3 through the at least one conductive via 106 penetrating the first interlayer dielectric layer ILD, the second gate insulating layer GI-2, and the first gate insulating layer GI-1. Moreover, the hole forming the at least one conductive via 106 may share the same mask with the hole corresponding to the source 10406 and the drain 10408 mentioned above, that is, no additional mask is needed to form the holes, which reduces a manufacturing cost while enhancing the stability of the driving transistor 1040. Of course, in other embodiments, the potential of the second electrode plate 1032 of the storage capacitor 103 is the same as the potential of the ELVDD, the second metal layer M2 includes a first portion connected to the second electrode plate 1032 and located in the non-display region CC. In this case, the shielding layer 102 may also be electrically connected to the first portion through a conductive via penetrating the first interlayer dielectric layer ILD and the second gate insulating layer GI-2, such that the potential of the shielding layer 102 is the same as the potential of the second electrode plate 1032. This design may reduce the depth of the conductive via, thereby reducing the difficulty in forming the hole corresponding to or forming the conductive via.

In the case that the material of the channel region 10400 of the driving transistor 1040 is an N-type semiconductor, that is, in case that the driving transistor 1040 is an NMOS transistor, the shielding layer 102 has a fixed low-level potential, for example, the shielding layer 102 has the same potential as the power line ELVSS or the signal line VREF. The fixed high-level potential has a lever higher than the fixed low-level potential. This design may ensure that the introduced shielding layer 102 will not affect the normal turning on of the driving transistor 1040 at the corresponding position. In some embodiments, when the ELVSS power line is located in the third metal layer M3, similar to FIG. 2, the shielding layer 102 may be electrically connected to the ELVSS power line in the third metal layer M3 through the at least one conductive via 106 penetrating the first interlayer dielectric layer ILD, the second gate insulating layer GI-2, and the first gate insulating layer GI-1. The hole forming the conductive via 106 may share the same mask with the holes forming the source 10406 and the drain 10408 mentioned above, that is, no additional mask is needed to form the holes, which reduces the manufacturing cost while enhancing the stability of the driving transistor 1040. Of course, in other embodiments, the shielding layer 102 may also be electrically connected to the VREF signal line located in the second metal layer M2. Or, the potential of the second electrode plate 1032 of the storage capacitor 103 is the same as the potential of the ELVSS, the second metal layer M2 includes the first portion connected to the second electrode plate 1032 and located in the non-display region CC. In this case, the shielding layer 102 may also be electrically connected to the first portion through a conductive via penetrating the first interlayer dielectric layer ILD and the second gate insulating layer GI-2, such that the potential of the shielding layer 102 is the same as that of the second electrode plate 1032. This design may reduce the depth of the conductive via, thereby reducing the difficulty in forming the hole corresponding to the at least one conductive via.

As further shown in FIG. 2, the array substrate 10 provided in some embodiments of the present disclosure further includes a second buffer layer 105. The second buffer layer 105 covers one side of the substrate 100 close to the shielding layer 102, and the shielding layer 102 is located between the first buffer layer 108 and the second buffer layer 105. The material of the second buffer layer 105 may include silicon nitride or the like, which has functions of thermal insulation and blocking metal ions.

Figure 4:
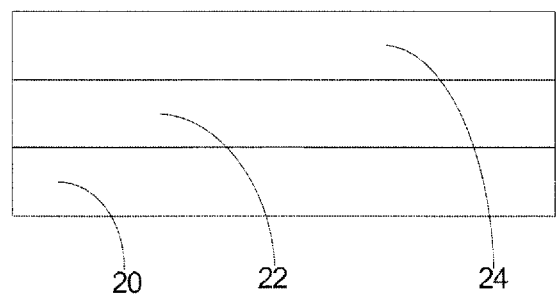
FIG. 4 is a schematic structural view of a display panel according to some embodiments of the present disclosure.

FIG. 4 is a schematic structural view of an embodiment of a display panel of the present disclosure. As shown in FIG. 4, the display panel includes an array substrate 20, and the array substrate 20 may be the array substrate described in any of the above embodiments.

Of course, in other embodiments, the display panel may also include other structures, such as a light-emitting layer 22 located on one side of the array substrate 20, an encapsulation layer 24 located on one side of the light-emitting layer 22 opposite to or away from the array substrate 20, and the like.

The above description is only some embodiments of the present disclosure and does not limit the scope of the present disclosure. Any equivalent structures or equivalent process transformations made based on the contents of the present disclosure and drawings, or directly or indirectly applied in other related technical fields, are also included in the scope of the patent protection of the present disclosure.

What is claimed is:

1. An array substrate, comprising:
   a substrate;
   a patterned shielding layer, having a fixed potential, arranged on one side of the substrate, and comprising a plurality of shielding units connected to each other; and
   a driving circuit layer, arranged on one side of the shielding layer away from the substrate and comprising a plurality of driving transistors, wherein an orthographic projection of each of the plurality of driving transistors projected on the shielding layer at least partially covers a corresponding one of the shielding units,
   wherein the plurality of driving transistors are arranged along a first direction and a second direction intersected with the first direction; and
   the shielding layer further comprises a plurality of first connecting members, and two adjacent shielding units of the plurality of shielding units are connected to each other through a corresponding one of the plurality of first connecting members in the first direction.

2. The array substrate according to claim 1, wherein
   the shielding layer further comprises a plurality of second connecting members, and two adjacent first connecting members of the plurality of first connecting members are connected to each other through a corresponding one of the plurality of second connecting members in the second direction.

3. The array substrate according to claim 2, wherein
   each of the plurality of second connecting members extends in a straight line, a curved line, or a zigzag line.

4. The array substrate according to claim 2, wherein the driving circuit layer comprises a plurality of switching transistors;
   an orthographic projection of each of the plurality of second connecting members projected on the substrate is non-overlapping with an orthographic projection of a channel of a corresponding one of the plurality of switching transistors or an orthographic projection of any other metal wiring in the driving circuit layer projected on the substrate.

5. The array substrate according to claim 2, wherein
   the plurality of shielding units, the plurality of first connecting members, and the plurality of second connecting members are integrally formed.

6. The array substrate according to claim 1, wherein
   the array substrate comprises a display region and a non-display region surrounding the display region;
   in the first direction, a part of the shielding layer in the non-display region is electrically connected to a wiring, which has a fixed potential, of the driving circuit layer arranged in the non-display region through at least one conductive via.

7. The array substrate according to claim 6, wherein
   in the first direction, the wiring having a fixed potential is arranged in the non-display region, at least two first connecting members of the plurality of first connecting members extend into the non-display region, and each of the at least two of the plurality of first connecting members extending into the non-display region is electrically connected to the wiring having the fixed potential through a corresponding one of the at least one conductive via.

8. The array substrate according to claim 7, wherein
in the second direction, at least one of the plurality of second connecting members is arranged between two adjacent first connecting members of the at least two of the plurality of first connecting members extending into the non-display region, and a junction between each of the at least two of the plurality of first connecting members located in the non-display region and a corresponding one of the at least one of the plurality of second connecting members is electrically connected to the wiring having the fixed potential through the at least one conductive via.

9. The array substrate according to claim 8, wherein
the shielding layer further comprises a plurality of third connecting members, and the plurality of third connecting members are arranged in the non-display region;
in the first direction, one of the plurality of third connecting members is disposed between two adjacent second connecting members of the plurality of second connecting members, and the at least one of the plurality of second connecting members located in the non-display region and the third connecting members are connected to each other to form a closed-rectangle structure.

10. The array substrate according to claim 6, wherein
the shielding units and the first connecting members in the first direction form one repeating unit, two opposite ends of the repeating unit are located in the non-display region and are electrically connected to the wiring having the fixed potential through the at least one conductive via, respectively.

11. The array substrate according to claim 6, wherein
a first buffer layer is arranged between the driving circuit layer and the shielding layer, and each of the plurality of driving transistors comprises a channel region arranged above the first buffer layer; and
wherein the channel region of each of the plurality of driving transistors has a corresponding one of the plurality of shielding units arranged below, and an orthographic projection of the channel region projected on the shielding layer is located in the corresponding one of the plurality of shielding units.

12. The array substrate according to claim 11, wherein
the driving circuit layer further comprises a storage capacitor;
in a direction away from the substrate, the driving circuit layer sequentially comprises a patterned polysilicon active layer, a first gate insulating layer, a first patterned metal layer, a second gate insulating layer, a second patterned metal layer, a first interlayer dielectric layer, and a patterned source-drain layer; the patterned polysilicon active layer comprises the channel region; the first patterned metal layer forms a gate of each of the plurality of driving transistors and a first electrode plate of the storage capacitor, the second patterned metal layer forms a second electrode plate of the storage capacitor, and the patterned source-drain layer forms a source and a drain of each of the plurality of driving transistors;
wherein an orthographic projection of the gate and an orthographic projection of the second electrode plate projected on the shielding layer cooperatively cover the corresponding one of the plurality of shielding units, or the orthographic projection of the gate projected on the shielding layer covers the corresponding one of the plurality of shielding units.

13. The array substrate according to claim 12, wherein the driving circuit layer further comprises a third metal layer, wherein the third metal layer forms the patterned source-drain layer and a power line;
the at least one conductive via is defined in the first interlayer dielectric layer, the second gate insulating layer, and the first gate insulating layer; the part of the shielding layer in the non-display region is electrically connected to the power line in the third metal layer through the at least one conductive via penetrating the first interlayer dielectric layer, the second gate insulating layer, and the first gate insulating layer.

14. The array substrate according to claim 12, wherein
the channel region is a P-type semiconductor and the shielding layer has a fixed high-level potential; or
the channel region is an N-type semiconductor and the shielding layer has a fixed low-level potential, and the fixed high-level potential has a level higher than the fixed low-level potential.

15. The array substrate according to claim 14, wherein
a potential of the second electrode plate is the same as the potential of the wiring having the fixed potential, and a potential of the shielding layer is the same as the potential of the second electrode plate.

16. The array substrate according to claim 15, wherein
the wiring having the fixed potential is arranged in the second metal layer or the third metal layer, and the shielding layer is electrically connected to the wiring having the fixed potential arranged in the second metal layer or the third metal layer through the conductive via; or
the second metal layer comprises a first portion connected to the second electrode plate and located in the non-display region, and the shielding layer is electrically connected to the first portion through the at least one conductive via.

17. The array substrate according to claim 11, further comprising:
a second buffer layer, covering one side of the substrate close to the shielding layer, wherein the shielding layer is arranged between the first buffer layer and the second buffer layer.

18. The array substrate according to claim 1, wherein
the material of the shielding layer comprises a non-light-transmitting metal or a semiconductor.

19. A display panel, comprising:
an array substrate, comprising:
a substrate;
a patterned shielding layer, having a fixed potential, arranged on one side of the substrate, and comprising a plurality of shielding units connected to each other; and
a driving circuit layer, arranged on one side of the shielding layer away from the substrate and comprising a plurality of driving transistors, wherein an orthographic projection of each of the plurality of driving transistors at least partially covers a corresponding one of the shielding units;
an encapsulation layer; and
a light-emitting layer, disposed between the array substrate and the encapsulation layer;
wherein the plurality of driving transistors are arranged along a first direction and a second direction intersected with the first direction; and
the shielding layer further comprises a plurality of first connecting members, and two adjacent shielding units of the plurality of shielding units are connected to each other through a corresponding one of the plurality of first connecting members in the first direction.

* * * * *